(12) United States Patent
Ji et al.

(10) Patent No.: US 8,619,840 B2
(45) Date of Patent: Dec. 31, 2013

(54) APPARATUS AND METHODS FOR SAMPLING RATE CONVERSION FOR WIRELESS TRANSCEIVERS

(75) Inventors: Zhu Ji, San Diego, CA (US); Brian Clarke Banister, San Diego, CA (US); Inyup Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 307 days.

(21) Appl. No.: 13/033,902

(22) Filed: Feb. 24, 2011

(65) Prior Publication Data

US 2012/0051407 A1 Mar. 1, 2012

Related U.S. Application Data

(60) Provisional application No. 61/308,790, filed on Feb. 26, 2010.

(51) Int. Cl.
*H04B 1/38* (2006.01)

(52) U.S. Cl.
USPC ........... 375/219; 375/225; 375/250; 375/354; 375/355; 341/61; 341/118; 341/119; 341/143; 341/155

(58) Field of Classification Search
USPC ............ 375/219, 225, 350, 354, 355; 341/61, 341/118, 119, 143, 155
See application file for complete search history.

(56) References Cited

U.S. PATENT DOCUMENTS

| | | | |
|---|---|---|---|
| 5,274,372 A * | 12/1993 | Luthra et al. | 341/61 |
| 6,535,565 B1 | 3/2003 | Girardeau, Jr. et al. | |
| 7,236,110 B2 * | 6/2007 | Antonesei | 341/61 |
| 7,439,884 B2 * | 10/2008 | Mogi et al. | 341/61 |
| 2006/0195883 A1 * | 8/2006 | Proctor et al. | 725/127 |

OTHER PUBLICATIONS

Gardner F., "Interpolation in Digital Modems. Part I: Fundamentals" IEEE Transactions on Communications, IEEE Service Center, Piscataway, NJ, USA, vol. 41, No. 3, Mar. 1, 1993, pp. 501-507, XP000372693.

International Search Report and Written Opinion—PCT/US2011/026254—ISA/EPO—Sep. 19, 2011.

Jussi Vesma, "A Frequency-Domain Approach t o Pol ynomi al—Based Interpolation and the Farrow Structure," IEEE Transactions on Circuits and Systems 11: Express Briefs, IEEE Service Center, New York, NY, US, vol. 47, No. 3, Mar. 1, 2000, XP011013200.

(Continued)

*Primary Examiner* — Leon Flores
(74) *Attorney, Agent, or Firm* — Kam T. Tam

(57) ABSTRACT

Disclosed are methods and apparatus for sampling rate conversion in a wireless transceiver. The methods and apparatus achieve agile setting of sampling rates or resampling by adaptively setting a sampling rate of a signal based on at least one performance requirement of the transceiver. In particular, the methods and apparatus perform sampling of an input signal at a first sampling rate to gain one or more input signal samples. The input signal samples are then filtered using parallel or polyphase filtering operating at a second sampling rate lower than the first sampling rate. The filtered samples are then interpolated at the second sampling rate to achieve resampling of the input signal. Polyphase filtering affords an effectively high input sampling rate for good spectrum image rejection, while allowing the second sampling rate to be effectively much lower than the first rate, thereby reducing the complexity of multiplier operations for interpolation.

48 Claims, 7 Drawing Sheets

(56) References Cited

OTHER PUBLICATIONS

Saramaki T et al., "An Efficient Approach or Conversion Between Arbitrary Sampling Frequencies,"1996 IEEE International Symposium on Circuits and Systems (ISCAS), Circuits and Systems Connecting the World. Atlanta, May 12-15, 1996, [IEEE International Symposium on Circuits and Systems (ISCAS)], New York, IEEE, US, May 12, 1996, pp. 285-288, XP000948145.

Gardner, Floyd M. "Interpolation in Digital Modems—Part I: Fundamentals" IEEE Transactions on Communications, Mar. 1993, pp. 501-506, vol. 41, No. 3.

* cited by examiner

APPARATUS AND METHODS FOR SAMPLING RATE CONVERSION FOR WIRELESS TRANSCEIVERS

CLAIM OF PRIORITY UNDER 35 U.S.C. §119

The present Application for patent claims priority to Provisional Application No. 61/308,790 entitled "APPARATUS AND METHODS FOR SAMPLING RATE CONVERSION FOR WIRELESS TRANSCEIVERS" filed Feb. 26, 2010, and assigned to the assignee hereof and hereby expressly incorporated by reference herein.

BACKGROUND

1. Field

The present disclosure relates generally to apparatus and methods for sampling rate conversion for wireless transceivers, and more specifically to apparatus and methods for efficient and flexible sampling rate conversion that is adaptive to system performance of the wireless transceivers.

2. Background

Advanced wireless transceivers need to support various sampling rates in either a receive chain or transmit chain to accommodate different system bandwidths, or different operating bands used in such transceivers. One part of accommodating different bandwidths, such as in baseband processing of a transceiver, is through sampling rate conversion that converts one sampling rate of a signal to another sampling rate. Such conversion could be performed at the output of an analog-to-digital converter (ADC), the input of a digital-to-analog converter (DAC), or any other portions of baseband processing utilizing sampling of signals requiring conversion or adjustment of the sampling rates. Conventional sampling rate conversion (also termed herein as "resampling") used in transceivers to accommodate different bandwidths or bands may include integer downsampling (i.e., decreasing the rate at which a signal is sampled by an integer factor) or upsampling (i.e., increasing a sampling rate of a signal by an integer factor) or fractional sampling (i.e., changing the sampling rate according to a predetermined fractional value). These conventional techniques, however, cannot achieve sampling rate conversion for any desired specific resampling ratios, but are limited to the integer or fractional values. Thus, these conventional techniques do not have the flexibility to convert sampling rates to any desired other sampling rate.

Furthermore, conventional linear interpolators, which are used in sampling rate conversion, usually provide limited image rejection especially for wideband cellular systems such as OFDMA-based systems including Long Term Evolution (LTE), LTE Advanced, WiMax (IEEE 802.16) and Ultra Mobile Broadband (UMB). That is, the spectrum of the resampled signal in a conventional interpolator may contain several unwanted images (or aliases) of the desired signal spectrum and it is desirable to reject these unwanted images, typically through filtering. High-order interpolators with high input sampling rates can achieve better image rejection. Such interpolators, however, have high operating or sampling rates that typically require multiple numbers of full multipliers, which become extremely costly for high-speed wideband wireless transceivers in terms of hardware and power consumption. Accordingly, a need exists for more efficient and flexible sampling rate conversion with high rate input sampling to ensure proper image rejection, but with less cost in terms of hardware and power consumption.

SUMMARY

According to an aspect, a method for sampling rate conversion in a transceiver is disclosed. The method includes sampling an input signal at a first sampling rate to achieve one or more input signal samples. Additionally, the method includes filtering the input signal samples using a plurality of parallel filters at a second predetermined sampling rate lower than the first sampling rate, and interpolating the filtered samples at the second sampling rate to achieve output samples at a sampling rate different from a sampling rate of the input signal.

According to another aspect, an apparatus for sampling rate conversion in a transceiver is disclosed. The apparatus includes means for sampling an input signal at a first sampling rate to achieve one or more input signal samples. Further, the apparatus includes means for filtering the input signal samples using a plurality of parallel filters at a second predetermined sampling rate lower than the first sampling rate, and means for interpolating the filtered samples at the second sampling rate to achieve output samples at a sampling rate different from a sampling rate of the input signal.

In yet a further aspect, an apparatus for sampling rate conversion in a transceiver is disclosed. The apparatus includes an upsampler configured to set the rate of sampling of an input signal at a first sampling rate to achieve one or more input signal samples. Also included is a polyphase filter comprising a plurality of parallel filters and configured to filter the input signal samples at a second predetermined sampling rate lower than the first sampling rate. Finally, the apparatus includes an interpolator configured to interpolate the filtered samples at the second sampling rate to achieve resampling of the input signal.

In still one more aspect, a computer program product comprising a computer-readable medium is disclosed. The medium includes code for causing a computer to sample an input signal at a first sampling rate to achieve one or more input signal samples in a transceiver. The medium also includes code for causing a computer to filter the input signal samples using a plurality of parallel filters at a second predetermined sampling rate lower than the first sampling rate, and code for causing a computer to interpolate the filtered samples at the second sampling rate to achieve output samples at a sampling rate different from a sampling rate of the input signal.

DETAILED DESCRIPTION

The present disclosure provides apparatus and methods for sampling rate conversion that achieve better flexibility and efficiency over conventional integer up/downsampling and fractional sampling. In particular, the present apparatus and methods afford agile sampling (i.e., efficient and flexible sampling) as responsive to transceiver requirements, such as a function of RF bands or system bandwidths for wireless transceivers. Such agile sampling rate conversion provides better system performance and allows more flexible system configurations. Additionally, the disclosed apparatus and methods provide agile sampling rate conversion responsive to transceiver requirements, while also achieving good image rejection by allowing input sampling at a high rate and reducing hardware requirements and power consumption by affording filtering and interpolation (i.e., multiplication operations) at a lower sampling rate.

The techniques described herein may be used for various wireless communication networks such as Orthogonal Frequency Division Multiplexed (OFDM) Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Ultra Mobile Broadband (UMB), Universal Terrestrial Radio Access (UTRA), cdma2000, etc. UTRA includes Wideband-CDMA (W-CDMA) and Low Chip Rate (LCR). cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16 (WiMax), IEEE 802.20, Flash-OFDM, etc. UTRA, E-UTRA, and GSM are part of Universal Mobile Telecommunication System (UMTS). Long Term Evolution (LTE) is an upcoming release of UMTS that uses E-UTRA. UTRA, E-UTRA, GSM, UMTS, LTE, and LTE Advanced are described in documents from an organization named "3rd Generation Partnership Project" (3GPP). cdma2000 is described in documents from an organization named "3rd Generation Partnership Project 2" (3GPP2). This listing is not meant to be exhaustive and those skilled in the art will appreciate that the methods and apparatus are applicable to other various radio technologies and standards are known in the art.

The word "exemplary" is used herein to mean "serving as an example, instance, or illustration." Any embodiment described herein as "exemplary" is not necessarily to be construed as preferred or advantageous over other embodiments.

Figure 1:
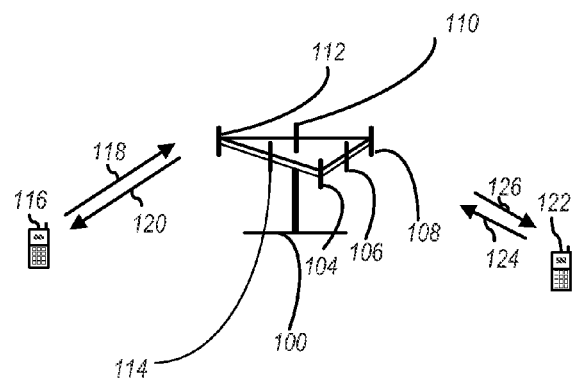
FIG. 1 illustrates a multiple access wireless communication system in which the present apparatus and methods.

Referring to FIG. 1, an example of a multiple access wireless communication system in which the present methods and apparatus may be employed is shown. A Node B, access point (AP), or base station 100 includes multiple antenna groups, one including 104 and 106, another including 108 and 110, and an additional including 112 and 114. In FIG. 1, only two antennas are shown for each antenna group, however, more or fewer antennas may be utilized for each antenna group. A User Equipment (UE), access terminal (AT) or wireless terminal 116 is in communication with antennas 112 and 114, where antennas 112 and 114 transmit information to access terminal 116 over a downlink or forward link 120 and receive information from access terminal 116 over an uplink or reverse link 118. Access terminal 122 is in communication with antennas 104 and 106, where antennas 104 and 106 transmit information to access terminal 122 over forward link 126 and receive information from access terminal 122 over reverse link 124. In an FDD system, communication links 118, 120, 124 and 126 may use different frequency for communication. For example, forward link 120 may use a different frequency then that used by reverse link 118.

An access point may be a fixed station used for communicating with the terminals and may also be referred to as an access point, a Node B, base station or some other terminology. An access terminal may also be called an access terminal, user equipment (UE), a wireless communication device, terminal, access terminal or some other terminology.

Figure 2:
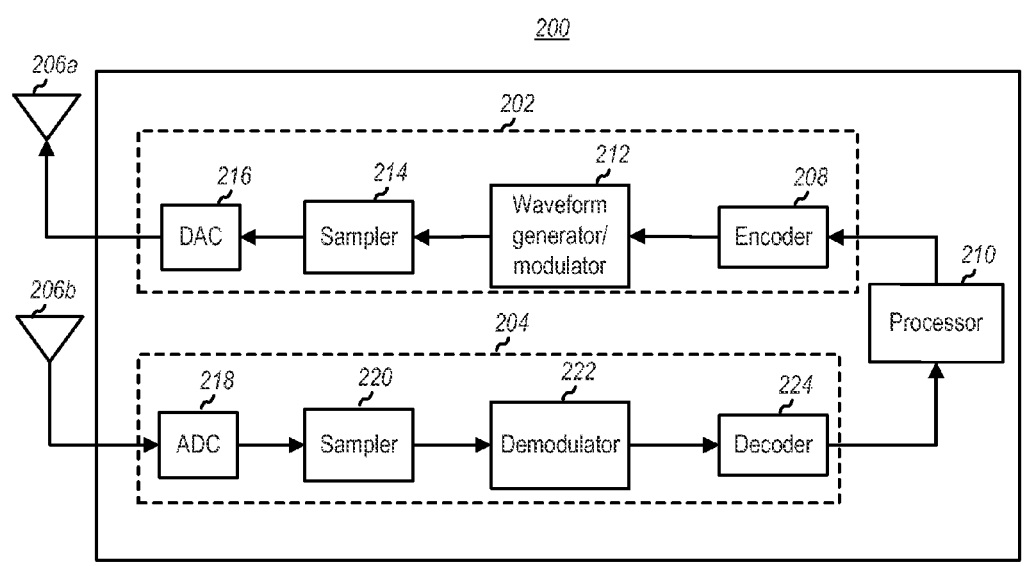
FIG. 2 is a block diagram of a transceiver device in which the methods and apparatus for dynamic data-based scaling of data may be employed.

Referring to FIG. 2, an exemplary block diagram of a wireless transceiver 200 that may employ the presently disclosed methods and apparatus is illustrated. Transceiver 200 is shown having both transmitter (TX) and receiver (RX) portions 202 and 204, respectively. It is within either the TX or RX portions 202, 204, in particular, where the presently disclosed methods and apparatus may be employed. Of further note, transceiver 200 may be embodied by either AT 122 or AP 100 in FIG. 1, which may employ any or all of the methods and apparatus for agile resampling disclosed herein. It is further noted that the presently disclosed apparatus and methods for resampling are applicable to one or both the transmit and receive portions 202 and 204.

As illustrated, the transceiver 200 includes an antenna 206 or antennas (206a and 206b) that receive and transmit wireless signals. TX portion 202 may include an encoder 208 or equivalent functionality for encoding a received data stream from a processor 210, such as a digital signal processor (DSP) as an example. The encoded data from the encoder 208 is delivered to a waveform generator 212, which includes modulation. For illustration purposes, a sampling block 214 is illustrated as the portion of the transmit chain 214 where resampling according to the present disclosure is performed. This may include upsampling (or downsampling), filtering, as well as interpolation of the input signal samples from the waveform generation block 212. Finally, a digital-to-analog converter (DAC) 216 converts the signal to an analog signal for RF transmission by an RF transmitter (not shown) via antenna 206a.

The antenna (e.g., 206b) also delivers a received signal to an analog-to-digital converter (ADC) 218 in the receive portion 204. ADC 218 converts the analog signal to a digital signal and outputs the digital signal to a sampler 220. Sampler 220 may also be configured to resample including upsampling (or downsampling), filtering, as well as interpolation of the input signal samples. The output of sampler 220, which is input to a demodulator 222 and a decoder 224. The decoder outputs a serial bit stream for use by a processor 210 in the device 200.

It is noted that the functional blocks illustrated in FIG. 2 be implemented as hardware, software, or firmware within a transceiver apparatus, such as device 200. Additionally, in the case of a software implementation, the device 200 could include a Mobile Station Modem (MSM) or similar integrated circuit, such as an Application Specific Integrated Circuit (ASIC) including or interfacing with a computer readable medium having instructions stored thereon, the stored instructions, when executed by a processor, cause the processor to perform the methods described above.

Before discussing the present methods and apparatus, and by way of instruction, it is noted here that the idea of agile sampling rate conversion or resampling is to adaptively set the sampling rate of the digital signals in the receive or transmit chains to be any frequency (i.e., not limited to integer or rational multiple of system natural frequencies) responsive to the specific performance requirements or constraints of a wireless system. In particular, the use of agile resampling can be beneficial in a number of scenarios that may occur in different wireless devices, which are discussed below.

In one scenario, in a system having different RF bands, there may exist different requirements regarding channel power leakage across adjacent RF frequency bands and the power suppression on the signal images. Thus, the ability to adaptively set the sampling rate will engender better optimization of power suppression in a multiple-band wireless device, and is more flexible and robust by allowing the sampling rate to be set adaptively and responsive to system conditions.

In another example, multi-mode or multi-technology wireless devices (e.g., devices capable of operating in different technologies such as UMTS, CDMA2000 and LTE multi-mode devices) need to support several different technologies within the same device. The sampling rate settings of each technology need to be carefully designed so that the signal images of each mode do not degrade the signal performance of other modes. Furthermore, once the RF band changes for one or some of modes, all the sampling rate settings may need to be readjusted to proper settings so that the systems still maintain the desired performances. Accordingly, a flexible technique for adaptively adjusting or varying sampling rate ratios such as the presently disclosed agile resampling is beneficial. In a particular example of this scenario, it is known to have wireless devices operable for multi-modes or multi-technologies, such as a multi-mode modem that supports multiple technologies including both LTE and GPS. In such a device the digital-to-analog converter (DAC) sampling rate in a transmitter portion for LTE would need to be set properly so that it will not produce images that interfere with received GPS bands considering that received GPS signals are typically very weak and may be relatively dominated by adjacent system images of transmitted signals for the LTE system. In order to avoid interfering with the GPS bands, a resampler used in setting the LTE DAC sampling rate would benefit from being able to adaptively cause the LTE DAC sampling rate to be set to a frequency value far different from the GPS signal at 230.4 MHz. With more RF band support or for different system bandwidth in LTE wireless devices, it is evident that in this scenario the DAC resampling rates will need to be adjusted accordingly, and it would be beneficial to afford greater control of setting the resampling rates.

Another scenario that can benefit from agile resampling is where systems support multiple system bandwidths (such as in LTE, where a devices needs to support up to 6 different system bandwidths). Agile sampling rate settings can allow a wireless device to change the analog-to-digital convertor (ADC) or digital-to-analog converter (DAC) sampling rates according to different bandwidths, which affords power savings or enhanced performance. For example, if a smaller system bandwidth is selected, the device can choose a smaller ADC or DAC sampling rate to significantly save power. Alternatively, in a wide-band configuration that is required in LTE the system bandwidth can go up to 20 MHz, as an example. Accordingly, the ADC sampling rate needs to be set high enough to suppress the ADC quantization noise to a level low enough to have a required signal to noise ratio (SNR).

A particular scenario in a system supporting multiple system bandwidths, such as in LTE systems, that may benefit from agile resampling is a sigma-delta ADC in a receiver portion of an LTE device. With a sigma-delta ADC, the oversampling ratio of the ADC sampling rate over the natural system bandwidth needs to be maintained high enough to sufficiently suppress shaped-quantization noise from the sigma-delta ADC. Moreover, in order to achieve better clock frequency, the clock that drives the ADC is derived from a clock source with very high frequency and needs to be divided to obtain required clock rates to enable the ADC. Considering both the above constraints, the sampling rate at the ADC output needs to be agile to have better receiving signal qualities. For example, it may be desirable to allow clock settings in the case of an ADC clock may include various different and particular rates for LTE systems, such as 1.4, 3 and 5 MHz LTE channel bandwidth LTE systems or 10 MHz channel bandwidth LTE systems. Accordingly, in such case, the sampling rate for the ADC output would need to change responsively (i.e., agilely) to frequently changed clock settings of the ADC clock.

Figure 3:
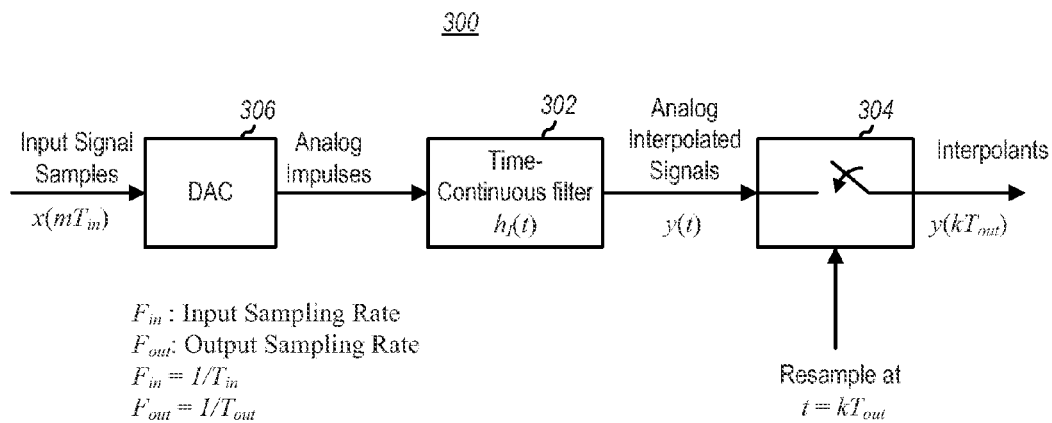
FIG. 3 is a block diagram of a resampler with time-continuous filtering that may be used in the apparatus of FIG. 2.

By way of further instruction, FIG. 3 illustrates an equivalent or theoretical model 300 of a resampler with time-continuous filtering that may be used within the presently disclosed sampling rate converter. This figure is merely provided for the purpose of illustrating how agile sampling rate conversion or resampling may be effected in an agile or adaptive manner in an interpolator performing sampling rate conversion and to provide a mathematical model for achieving resampling or interpolation by converting an input sampling rate $F_{in}$ (the inverse of period $T_{in}$) to an output sampling rate $F_{out}$ (or the inverse of period $T_{out}$). As will be explained in detail later, the concepts of this model are applied in the presently disclosed apparatus and methods to effect an adaptive or agile interpolation or sampling rate conversion of signal samples.

FIG. 3, in particular, models a conceptual hybrid analog/digital resampler with time-continuous filtering for image rejection. As illustrated, the model 300 includes a conceptual time-continuous, analog, interpolating filter 302 having an impulse response, $h_I(t)$ that receives analog impulses at intervals of $mT_{in}$ from a conceptual DAC 306 receiving an input sequence $x(mT_{in})$. The output of the time-continuous filter 302 can be written as:

$$y(t) = \sum_m x(m)h_I(t - mT_{in}). \quad (1)$$

By resampling y(t) at time instants $t=kT_{out}$ with a linear interpolation resampling device 304 (i.e., a linear, wherein an output rate period $T_{out}$ is synchronized with the output signal sampling rate, one can obtain the interpolants as:

$$y(kT_{out}) = \sum_m x(mT_{in})h_I(kT_{out} - mT_{in}) \quad (2)$$

Although model 300 merely illustrates a conceptual DAC 306 and filter 302, this conceptual figure illustrates that interpolants in a resampler may be computed digitally based on the known variables of the input sequence $x(mT_{in})$, the impulse response of the filter (i.e., $h_I(t)$), and the time instants of the input samples (i.e., mTin) and the desired time instants of the resampler output (i.e., $kT_{out}$). Accordingly to this end, a more useful format can be obtained by rearranging the indexing in equation (2). Considering that m is the input signal index, define a filter index i as:

$$i = \lfloor kT_{out}/T_{in} \rfloor - m \quad (3)$$

where $\lfloor x \rfloor$ is int[x] or, in other words, the largest integer not exceeding x. Further, a basepoint index and fractional interval may be defined, respectively, as follows:

$$m_k = \lfloor kT_{out}/T_{in} \rfloor$$

$$\mu_k = kT_{out}/T_{in} - m_k \quad (4)$$

where $0 \leq \mu_k < 1$. Accordingly, equation (2) can be rewritten as:

$$y(kT_{out}) = y[(m_k + \mu_k)T_{in}] \qquad (5)$$

$$= \sum_{i=I_1}^{I_2} x[(m_k - i)T_{in}] h_I[(i + \mu_k)T_{in}]$$

where $I_1$ and $I_2$ determine the number of taps of a finite impulse response (FIR) interpolator. For example, for a linear interpolator $I_1=0$ and $I_2=1$. High-order interpolators can also be represented with different values of $I_1$ and $I_2$.

Figure 4:
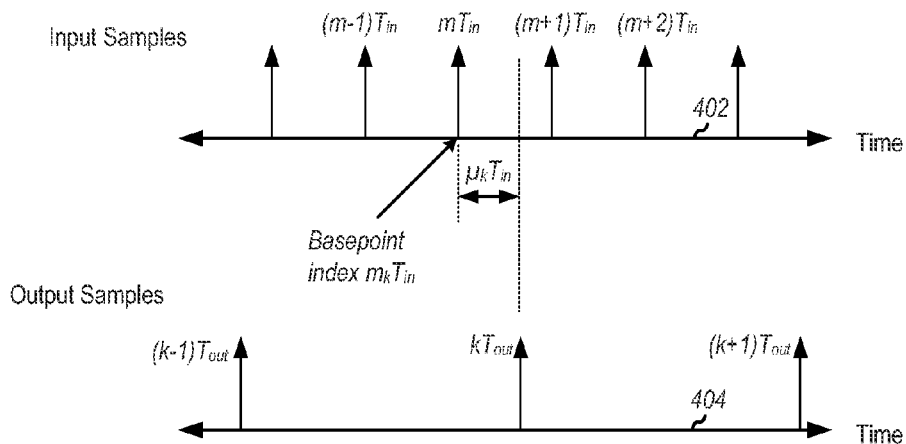
FIG. 4 is a graph illustrating a timing relationship between input and output samples in the apparatus of FIG. 3.

FIG. 4 provides an illustration of the relationships between the sample timing of the input and outputs of rate converter 300, and is also provides an instructive illustration of the sample timing relationships for further examples that follow in this discussion. As illustrated, in an input sample timeline 402, samples occur at a periodicity of $T_{in}$ (or rate of $F_{in}=1/T_{in}$). Continuing with nomenclature used above, each sample occurs at time instants of a sequence of an integer signal index m, such that samples occur at time instants $(m-1)T_{in}$, $mT_{in}$, $(m+1)T_{in}$, and so forth. It is noted that the uniform amplitude of the illustrated input samples is merely exemplary and for convenience of illustration, and that one of ordinary skill in the art will appreciate that the actual amplitude is dependent on the input signal x.

An output sample timeline 404, the timeline being synchronous in time with timeline 402. Output samples or interpolants are output from the interpolator 304 of FIG. 3 at a periodicity of $T_{out}$ (or rate of $F_{out}=1/T_{out}$), such that samples occur at time instants $(k-1)T_{out}$, $kT_{out}$, $(k+1)T_{out}$, and so forth. As may be seen in the example of FIG. 4, the output samples evince a resampling of the input samples that is downsampled (i.e., occurring at frequency lower than the input). As one skilled in the art will appreciate, although not illustrated, the output samples from the interpolator 304 may also have a sample frequency higher than the sample frequency of the input (i.e., upsampled).

Furthermore, it is noted that based on equations (4) above, the time relationship between a basepoint index sample time instant $m_kT_{in}$ of the input samples and an output time instant $kT_{out}$ of the output samples will be equal to $\mu_kT_{in}$. It is recognized then that the fractional interval $\mu_k$, which is derived, in part, based on the ratio of the input sampling rate and output sampling rate as may be seen from equation (4), may be calculated and utilized for adjusting the output sampling rate to any desired sampling, even for each interpolant output. Accordingly, such a fractional interval or similarly functioning control value may be computed and used with an interpolator to agilely or adaptively adjust its resultant output sampling rate.

It is further noted that the DAC illustrated by block 306 in FIG. 3 is differentiated from a DAC in a receiver, such as DAC 216, for example, and is, in essence, a virtual DAC shown to illustrate that analog impulses are input for use by filter 302. Additionally, block 306 represents a resampling functionality as expressed by equations (2) or (5) above.

Figure 5:
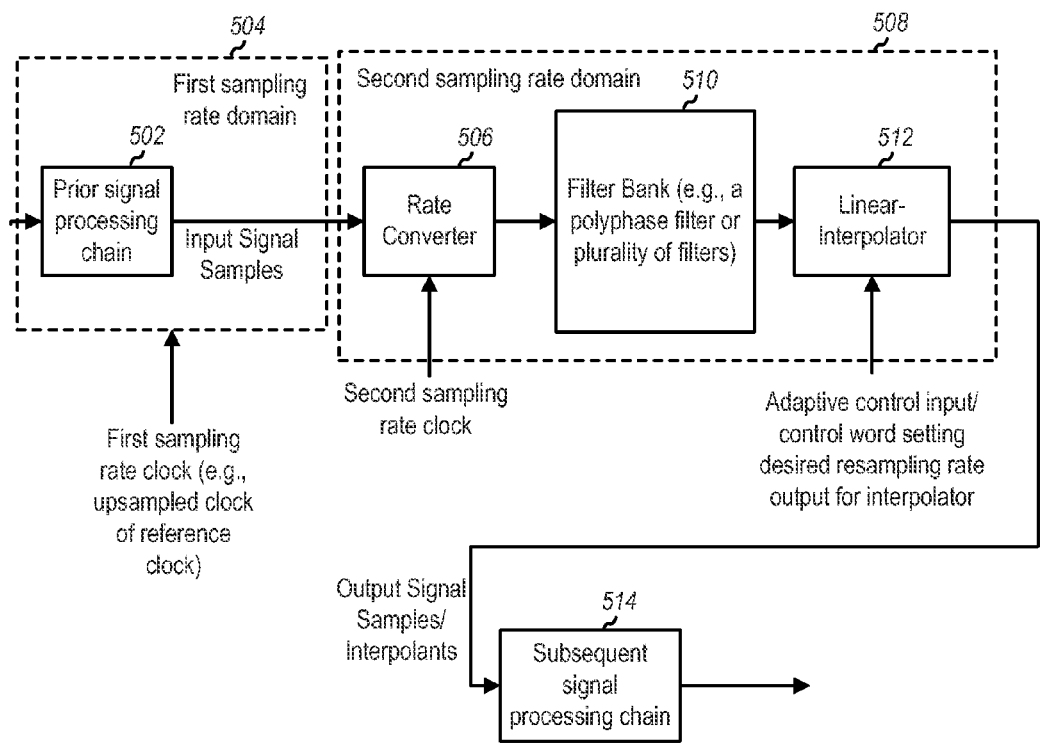
FIG. 5 is a diagram of an implementation of a resampler with parallel filtering that may be used in the apparatus of FIG. 2.

In order to have enough image rejection using linear-interpolation, such as the linear interpolation modeled in FIG. 3, the input sampling rate (e.g. Fin) to a sampling rate converter preferably should to be set to a rate high enough to reject images. However, it is not practical or efficient to actually clock the interpolation at such a high sampling rate. FIG. 5 illustrates another apparatus 500 for resampling, which may be used in the apparatus of FIG. 2, such as in sampler 214 or 220, for example. Apparatus 500 effects a higher input sampling rate while still utilizing a lower clock rate used for subsequent processing (e.g., filtering and linear interpolation) in the apparatus for resampling. Accordingly, apparatus 500 specifically achieves agile resampling or sampling rate conversion with good image rejection, while minimizing power consumption.

As illustrated, samples received from a prior signal processing chain 502 are sampled according to a first sampling rate clock input to establish a first sampling rate domain 504. The input sample rate, or rate at which digital samples are received from prior signal processing 502 is an input sampling rate that will ultimately be converted or resampled to an output sample rate at the output of apparatus 500. The first sampling rate clock may be derived from any known clock device, such an oscillator. It is noted that in an aspect the rate of the first sampling rate clock is set to high rate to ensure proper image rejection for images or aliases that occur from sampling. The particular rate may be determined by a controller (not shown) and set to any number of values dependent on the particular transceiver in which it is used.

In an aspect, the first sampling rate clock may have been derived by increasing or upsampling an external clock (not shown) by a factor, whether integer, fractional, or customized. The external clock may be a set clock such as a DAC clock or an ADC clock, as just a couple examples. It is further noted that the prior signal processing chain 502 delivers samples to apparatus 500 at a rate particular to its operation, and that the first sampling rate clock and attendant domain 504 effect sampling rate conversion of the input signals from 502 equal to the first sampling rate clock. This conversion is typically an upsampling to a rate higher than the sampling rate of the prior signal processing chain in order to effect better image rejection attendant with a higher sampling rate. Although not explicitly shown in FIG. 5 (but illustrated in FIG. 6 by CLK 1 and registers 604), domain 504 may be configured with the output of chain 502 passed through an upsampler to convert to the higher rate. In one example, the first sampling rate clock may effect upsampling of a reference clock by factor of 8 (i.e., increase the sampling rate by 8 times), but may be any value desirable to achieve proper image rejection. One skilled in the art will appreciate that the optimal amount by which the sampling rate is increased may be determined empirically based on particular system requirements, such as multiple bandwidths or frequencies, In the example of upsampling a reference clock by 8, the input signal samples leaving the first sampling rate domain 504 would deliver samples to another rate converter 506 at 8 times the rate as the sample rate of samples receiver from the prior processing chain 502 (e.g., $8 \times F_{in}$).

The input signal samples, after sampling rate conversion to the first sampling rate are then input to another rate converter 506 that is configured to change the sampling rate to a second sampling rate based on an input second sampling rate clock establishing a second sampling rate domain 508. In an aspect, the second sampling rate clock is lower than the first sampling rate clock of domain 504. The reason for this second sampling rate conversion is to effect operation of subsequent filtering and linear interpolation at a lower clock rate to realize power savings and reduce the processing required for interpolation (i.e., the number of multiplication operations).

However, in order to ensure that all of additional samples resultant from the upsampling of the first sample rate clock are accounted for in subsequent filtering, the output of rate converter 506 is then split and all of samples input into each one of a plurality of filters (not shown specifically in FIG. 5, but further illustrated by the example of FIG. 6) in a filter bank 510 consisting of a plurality of parallel filters or, in other words, a polyphase filter. Thus, by delivering the samples to parallel filters, although the filters operate at a second sampling rate (i.e., because the samples are input thereto at the second sampling rate from converter 506), all samples can nonetheless be processed or filtered by simply choosing one more outputs from particular filters of filter bank 510 at particular times to be input to a linear interpolator 512. Particular selection may be effected by any known device for selecting among multiple inputs, such as a multiplexer (not shown in FIG. 5, but further illustrated by the example of FIG. 6).

In an aspect, the filtering effected by filter bank 510 may be Cascaded Integrator-Comb (CIC) Finite Impulse Response (FIR) type filtering (e.g. a low pass filter with an impulse response or transfer function equal to $$\left(\sum_{i=0}^{7} z^i\right)^4 ).$$

or any other type of filtering, FIR or otherwise, that effects low pass filtering to remove high frequency images that may result from the upsampling effected by the first sampling rate clock. Furthermore, this exemplary FIR filter design can be replaced with other FIR filters according to particular application requirements, i.e., image rejection requirements. It is noted that the filter bank 510 is analogous to the conceptual filter 302 in FIG. 3 and may be implemented in accordance with the concepts discussed above in connection with FIG. 3.

Linear interpolator 512 receives selected filtered samples from selected ones of the plurality of filters 510 and performs interpolation (i.e., another resampling) to achieve desired output signal samples or interpolants at a predetermined output sampling rate. The particular rate may be set agilely or adaptively based in an adaptive control input that sets the resampling rate of the interpolator 512 to any desired rate. In an aspect, the desired output rate set by the control input is based upon various system requirements In an aspect, the linear interpolator 512 may be configured based on the concepts discussed previously with respect to FIG. 3, and equations (1)-(5). In another aspect, linear interpolator 512 may be configured with two filter taps, which indicates the outputs of two of the plurality of filters are selected to be input to interpolator 512 such that equation (5) above, which may be used in determining the interpolator 512 output, will merely require a single multiplication operation (e.g., the values $I_1$ and $I_2$ equal 0 and 1, respectively) to calculate the output signal samples or interpolants. Thus, when implemented in either hardware, logic, firmware, or software, the interpolation may be effectuated with low complexity and less power consumption.

Linear interpolator 512 outputs the signal samples or interpolants at the desired sampling rate determined by the control input setting to a subsequent signal processing chain 514 as shown in FIG. 5. It is noted that the subsequent signal processing chain 514 may be circuitry within either a receiver portion or transmitter portion of a transceiver. As two examples, the chain 514 could be a demodulator, such as demodulator 222 in FIG. 2 in the case of a receiver, or a DAC, such as DAC 216 in the case of a transmitter. Furthermore, it is noted that the subsequent signal processing chain may be clocked or sampling the signal samples or interpolants at the output sampling rate, or some other rate determined by an external clock input to the chain 514. According to an aspect, in order to save computing resources, linear interpolation resampler 512 may also be configured to implement a first order function requiring only one multiplier by reducing the rate, thus saving computing resources, as will be discussed in more detail later. It is noted that the linear interpolator 512 is analogous to the conceptual interpolator 304 in FIG. 3 and may be implemented in accordance with the concepts discussed above in connection with FIG. 3.

Figure 6:
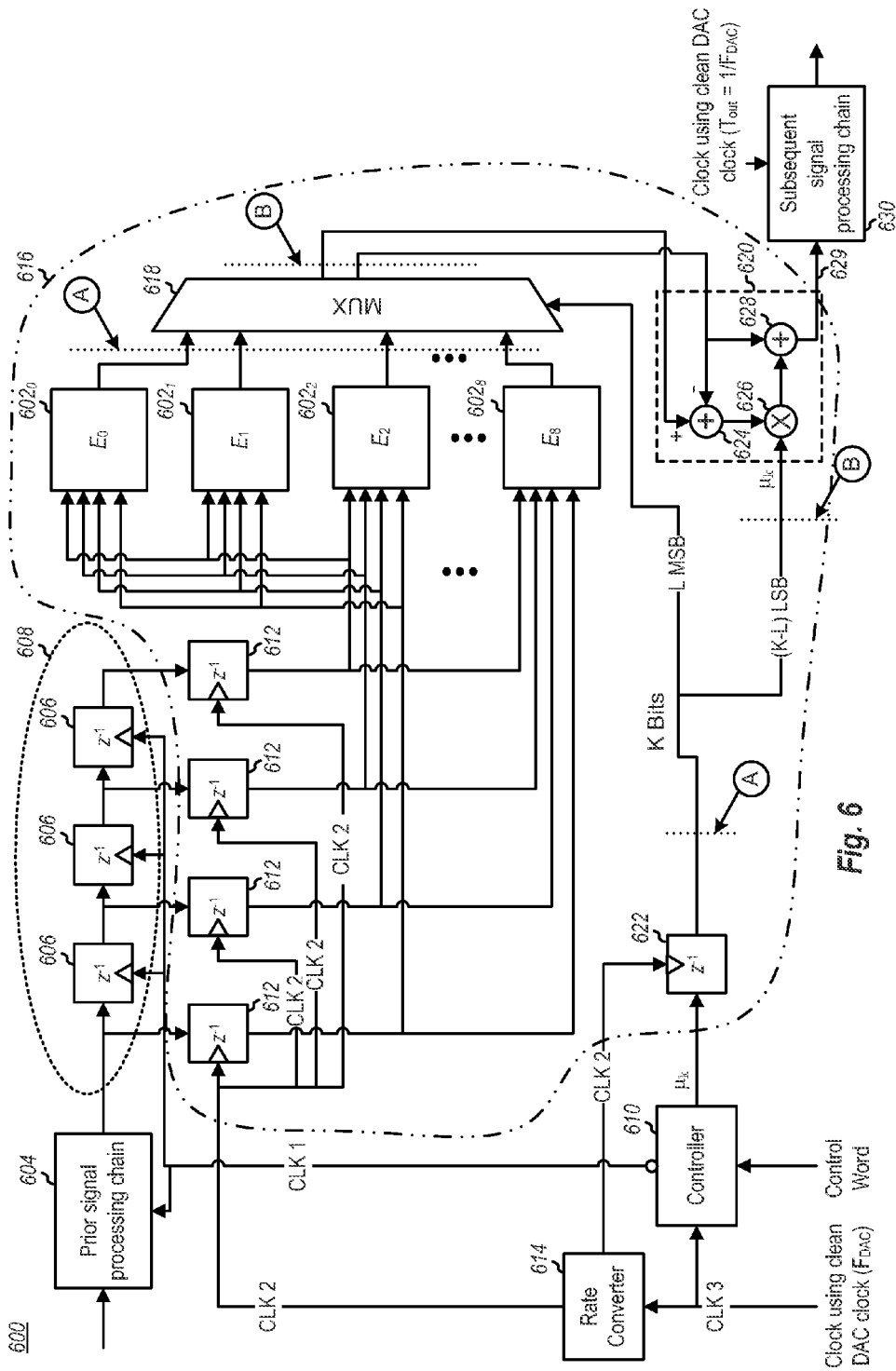
FIG. 6 is a diagram of still another implementation of a resampler with parallel polyphase filtering that may be used in the apparatus of FIG. 2.

FIG. 6 illustrates another exemplary apparatus 600 for sampling rate conversion with a specific polyphase-implementation of resampling with proper clocking and multiplexing (MUX) operations. It is also noted that the example of FIG. 6, in particular, illustrates an example of an implementation of a resampler 600 that may be useful in a transmit portion of a transceiver, in particular, but it is noted that the design is adaptable for use in receiver portions as well.

In the example of FIG. 6, resampler 600 utilizes a plurality of polyphase filters 602 in parallel enabling processing of input signal samples at a lower sampling rate than the increased input sampling rate. As illustrated in FIG. 6, signals are input to the resampler 600 from a prior signal processing chain 604, which may be any one of various signal processing functions or apparatus, such as a waveform generator 212 as one example. The output of the signals from unit 604 is clocked or sampled according to an input sampling rate $F_{in}$, which is also denoted as CLK 1. The signal samples from unit 604 are input to a series of delay registers 606, which are also clocked by CLK 1. As illustrated by dashed line 608, the time domain of CLK 1 encompasses the output of the processing chain 604 and the delay registers 606. Is noted that the CLK 1 may be supplied by a controller (e.g., an accumulator or NCO) 610, which will be discussed in further detail later. It is noted here, however, that in an aspect CLK 1 is gated by the inverse of a carry out of the controller 610 (in the case of a controller utilizing a numerically controlled oscillator (NCO), as discussed in more detail later) to reduce timing jitter.

The samples output from processing chain 604 and each of the delay registers 606 are input to another series of delay registers 612, which are clocked at another sampling rate denoted by CLK 2 that is different from CLK 1. In one example, CLK 2 may be derived by a rate converter 614 that converts the rate of an input clock, such as a digital-to-analog converter (DAC) clock ($F_{DAC}$) to another rate based on either division or multiplication by an integer value. For example, the integer value may be 8, where the sampling rate is decreased by a factor of 8. One skilled in the art will appreciate that the integer value may be selected according to various design considerations. It is noted that the rate converter 614 need not be an integer conversion, but may also be configured to convert rates based on a non-rational or fractional values as well. In an aspect, it is noted that the rate for CLK 2 may be set much lower than the rate of CLK 2. In the example of FIG. 6, the sampling rate effected CLK 2 is the output sampling rate for the resampler 600 (also denoted as $F_{out}$ or $1/T_{out}$). The boundary of the domain of CLK 2 in resampler 600 is also illustrated by dashed line 616. In a specific example, it is noted that the first sampling rate CLK 1 may be 128.88 MHz, and the second sampling rate CLK 2 set at approximately 61.44 MHz.

In a further aspect, it is noted that a downward rate conversion effected by rate converter 614 affords additional power savings. By converting to a lower clock rate for CLK 2, the polyphase filtering of filters 602 are operable at a lower rate or lower number of operations, which affords power savings of the filter operations.

The input samples gated or clocked by delay registers 612 are output to each of the plurality of filters 602 (e.g., $E_0$ through $E_8$, and designated with reference numbers $602_0$ through $602_8$ assuming for purposes of this example an upsampling by a factor of 8 requiring eight filters plus a ninth filter to account for wrap around), which are also operable under the time domain 616 of CLK 2. Because a plurality of filters or polyphase filtering is used, this eliminates the need to fully upsample due to this parallel processing. In addition, the outputs of polyphase filters 602 constitute a pipeline position A, which is a timing position occurring prior to further processing.

The output of each filter 602 is coupled to a multiplexer 618, which is utilized to enable the selection of the outputs of two of the plurality of filters 602 that are, in turn, input to an interpolation unit 620. That is, at one time instance (e.g., pipeline position B) outputs from only two of the plurality of filters 602 are input to the interpolator 620, as may be deduced from equations (1)-(5) above. The selection of the proper two of the plurality of filters 620 by control of multiplexer 618 ensures that spectral image rejection will be sufficient. In an aspect, multiplexer 618 is controlled using portion of the fraction interval; namely an L number of the most significant bits (MSB) of the fractional interval $\mu_k$ consisting of a total of K bits, the fractional interval being determined by controller (e.g., an accumulator or NCO) 610 and clocked by delay register 622 gated by CLK 2 as may be seen in FIG. 6. The output of delay register 622 corresponds to pipeline position A, which is correlated in time to the outputs of filters 602. In the particular example of FIG. 6, the number L is equal to three, such that the three MSBs of fractional interval $\mu_k$ are used to control the multiplexer 618 output.

According to an aspect, the two respective outputs from adjacent polyphase pairs of filters (e.g., $E_0$ and $E_1$ or $E_1$ and $E_2$, etc.) are output by multiplexer 618. For example, the output of polyphase filters $602_0$ and $602_1$ are selected and output by multiplexer 618. In the particular example of FIG. 6 polyphase filtering utilizes nine filters 602, where multiplexer 618 may be selected to output eight different outputs using three control bits where L=3 or three MSBs of fractional interval $\mu_k$ are used to control the multiplexer 618 selection, resulting in eight different possible binary control words. For example, if the three most significant bits of the fractional interval $\mu_k$ are 000, the multiplexer 618 would be controlled to output the outputs from polyphase filters $E_0$ and $E_1$. Continuing sequentially, as merely one example, when the output control bits are 001, the outputs of filters $E_1$ and $E_2$ are output by multiplexer 618, and so forth culminating with the most significant control bit combination 111 resulting in the outputs of filters $E_7$ and $E_8$ selected as the outputs of multiplexer 618. This control of multiplexer 618 ensure that the correct filters are selected based on the fractional interval $\mu_k$, which is computed by controller (e.g., an accumulator or NCO) 610 based on an input control word, which will be discussed later.

The output of multiplexer 618 and the input of the remaining K-L least significant bits (LSBs) of the fractional interval $\mu_k$ to the interpolation unit 620 occur at a pipeline position B indicated in FIG. 6. The two selected polyphase filter outputs that are output from multiplexer 618 are delivered to the interpolation unit 620 and, in particular, to an adder or summing function 624. In the particular example of FIG. 6, the output value from one of the filters 602 is made negative such that that value is subtracted from the value of the output of the other selected polyphase filter output. The resultant sum is then passed to a multiplier 626, which serves to multiply this result with the fractional interval $\mu_k$. Is noted here that this multiplier 626 is operated at a lower sample rate (i.e., in the domain of CLK 2), which affords lower complexity and cost for interpolation. Additionally, as only the output of two filters is selected at any one time, the effective rate is ⅛th operation. The product resultant from multiplier 626 is then input to an adder 628, which adds the previously subtracted output of one of the polyphase filters 602 to the product derived by multiplier 626.

The particular components of interpolator 620 effect the following relationship: $\mu_k E_a \, E_a+1$, where a=0, 1, . . . N, N being the total number of filter responses or filters E (i.e., 602). One skilled in the art will appreciate that this relationship may be deduced from equations (1) through (5), developed previously herein. In the example of FIG. 6, if the MSB of $\mu_k$ effect selection of the outputs of filters $E_0$ and $E_1$ by multiplexer 618, for example, the apparatus of interpolator 620 would yield the result $\mu_k E_0 + E_1$, which can also be expressed as $\mu_k(E_0 - E_1) + E_1$.

The resultant output of adder 628 (and interpolation unit 620) is interpolants or resampled data that has been adaptively resampled. These interpolants are then output to subsequent signal processing chain 630. Processing chain 630 may be clocked using the clean DAC clock at timing of $T_{out}$ equal to $1/F_{DAC}$. In an aspect, the DAC clock rate ($F_{DAC}$) may be higher than either CLK 1 or CLK 2 and the processing chain 630 upconverts the rate of processing to the predetermined, higher rate of $F_{DAC}$. It is further noted that this upconversion may be simply the reverse of the rate conversion performed by rate converter 614.

Turning to the controller 610, in particular, this unit is used to compute the fractional interval $\mu_k$ based on an input control word, which may be determined by a processor (e.g., a DSP) or any other suitable logic in the transceiver. In an aspect, the control word may be computed according to the relationship $1 - T_{DAC}/T_{in}$ where $T_{DAC}$ is the period of the DAC sampling rate (e.g., CLK 3), and $T_{in}$ is the period of input sampling rate (e.g., CLK 1). The control word is used to ensure that the computed fractional interval $\mu_k$ serves to identify the correct set of filter samples to be selected by the multiplexer 618 for proper polyphase filtering. Thus, the control word is, in part, based upon the particular sampling rate of a digital-to-analog converter of a transmit portion of a transceiver, such as in the present example of FIG. 6, or alternatively could be based on a sampling rate of an analog-to-digital converter in the case of a receiver or other processing in a transceiver. Accordingly, the control word is capable of being adaptively set based on a particular clock configuration for a multi-mode or multi-technology wireless device requiring different modes or clock rates for an ADC or a DAC. In other words, the control word is used to adaptively and agilely change or adjust the resampling performed by apparatus 600 responsive to requirements of the system in which apparatus 600 is employed. Accordingly, desired performance requirements of the transceiver, such as image rejection requirements, can be met by selecting the control word to ensure proper polyphase filtering and proper interpolation in unit 620. In an aspect, controller 610 may be implemented to include a numerically controlled oscillator (NCO) register, a phase accumulator, or other known digital signal generator that may use an input clock (e.g., a clean DAC clock) to create a clocked, discrete-time, discrete-valued signal. In such an implementation, the fractional interval $\mu_k$ may then computed by the controller 610 using an output of an NCO and the input control word based on a desired ratio of the input to output sampling rates.

As one skilled in the art will appreciate, the apparatus of FIG. 6 affords agile and efficient sampling rate conversion technique that can achieve flexible rate conversion to any sampling rate (i.e., not constrained to integer or rational resampling ratio), as well as having a low-complexity due to use of a linear interpolator and achieving very high image-rejection to spectrum aliasing introduced by the resampling. The use of polyphase filtering in FIG. 6 also affords a virtual high sampling rate using parallel digital signal processing. As mentioned before, through first order linear interpolation, only one multiplier is needed for resampling, which further reduces complexity and increases efficiency. It is also noted here that although the apparatus of FIG. 6 is shown in the context of a transmitter portion of transceiver, the apparatus and variations thereof are applicable to a receiver as well. Furthermore, on skilled in the art will appreciate that the systems of FIGS. 5 and 6 may be alternatively configured for downsampling of input signals to a lower sampling frequency.

Additionally, the filters 602 may be implemented by a Cascaded Integrator-Comb (CIC) Finite Impulse Response (FIR) filters similar to filter bank 510. One skilled in the art will appreciate, however, that the filters 602 are not limited to CIC FIR filtering, and that other FIR filter designs may be utilized according to the application requirements, i.e., image rejection requirements.

It is also noted that the first sampling rate, such as CLK 1, is determinable based upon specific performance requirements desired for a transceiver in which the resampler is used. For example, the control word input to controller 610 may be used to effect the setting of CLK 1 based on a desired or predetermined ratio of the input sampling rate to the output sampling rate. Furthermore the particular set rate for CLK 2, whether that setting be through an integer upsampling or fractional setting, may be based on desired operating conditions for the transceiver, such as in multi-mode or multi-technology wireless devices that support either different bandwidths or technologies having sampling rates for each technology or from multiple system bandwidth such as in LTE where the system bandwidth is varied or changing and the sampling rates. Additionally, particular filter coefficients may be predetermined for each of the plurality of filters (510 or 602) that, in part, determine particular impulse responses (e.g., $h_f$) of the different filters, which, in combination with the factional interval μk allows proper filtering for the particular rates of the prior and subsequent signal processing (e.g., a modulator, demodulator, DAC or ADC).

It is further noted that the output sampling rate of a resampling apparatus (e.g., 500 or 600) may be set to rates include non-integer rate conversion values and non-rational multiples of system natural frequencies of a wireless system in which the transceiver is operable with the agile resampling afforded by the present methods and apparatus. Additionally, the at least one performance requirement includes at least one or more radio frequency (RF) bands at which the transceiver is operable, such as in a multi-mode or multi-technology environment. The performance requirement may also include one or more system bandwidths of a wireless system in which the transceiver is operable, such as in a system supporting multiple bandwidths like LTE, for example.

Figure 7:
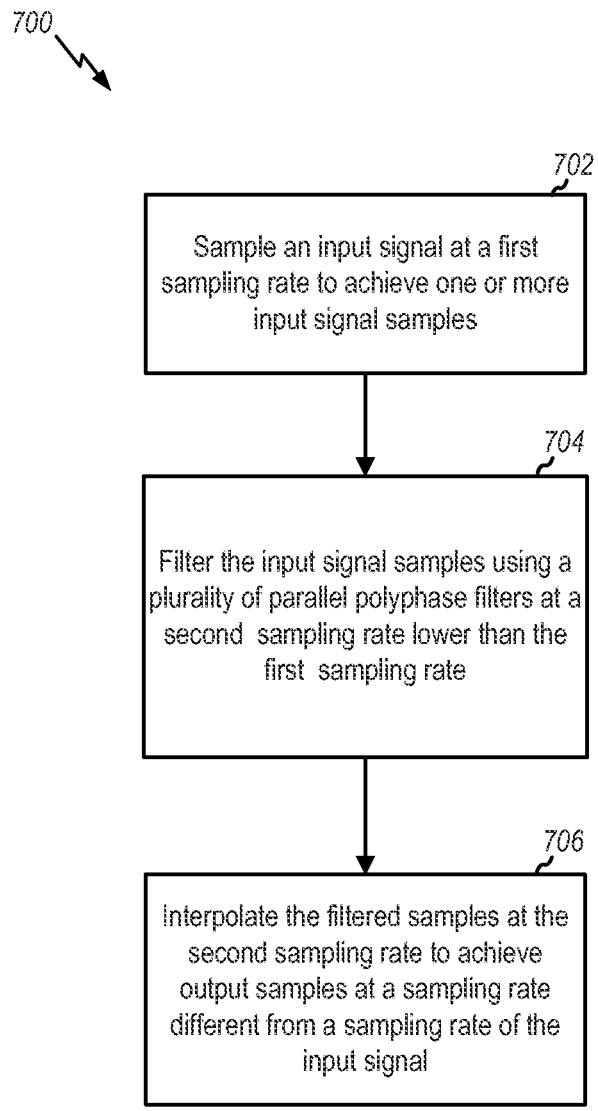
FIG. 7 is a flow diagram of a method for sampling rate conversion.

FIG. 7 illustrates an exemplary method 700 for sampling rate conversion in a wireless transceiver, such as transceiver 200 in FIG. 2. Method 700 includes a process of sampling an input signal at a first sampling rate to achieve one or more input signal samples as illustrated in block 602. This process may be effected by the first sampling rate clock in the example of FIG. 5 effecting rate conversion of the input signal samples or the combination of the functionalities of CLK 1 determined by controller 610, the prior signal processing chain 604, and delay registers 606 clocked by CLK 1 as illustrated in the apparatus of FIG. 6, as merely two examples.

After the sampling in block 702, the input signal samples are filtered using a plurality of parallel polyphase filters operating at a second predetermined sampling rate that is lower than the first sampling rate as shown in block 704. Additionally, the second sampling rate may be set based on at least one performance requirement of a wireless transceiver in which method 700 is utilized. In one example, the processes of block 704 may be implemented by rate converter 506 and filter bank 510 in FIG. 5. In another example, the polyphase filters 602 and registers 612 in combination with CLK 2 as illustrated in FIG. 6, or an equivalent, may be used to implement the processes of block 704. Additionally, the process of 704 may include selection among outputs of a plurality of polyphase filters as is accomplished by multiplexer 618 or similarly functioning device for selecting among a plurality of signals.

Method 700 also includes interpolating the filtered samples at the second sampling rate to achieve output samples at a sampling rate (e.g., $F_{out}$) different from a sampling rate of the input signal (e.g., $F_{in}$) as illustrated by block 706, or, in other words, resampling of the input signal. This process may be accomplished through a linear interpolating resampler such as linear interpolator 512 in the apparatus of FIG. 5 or interpolation unit 620 in the apparatus of FIG. 6.

Figure 8:
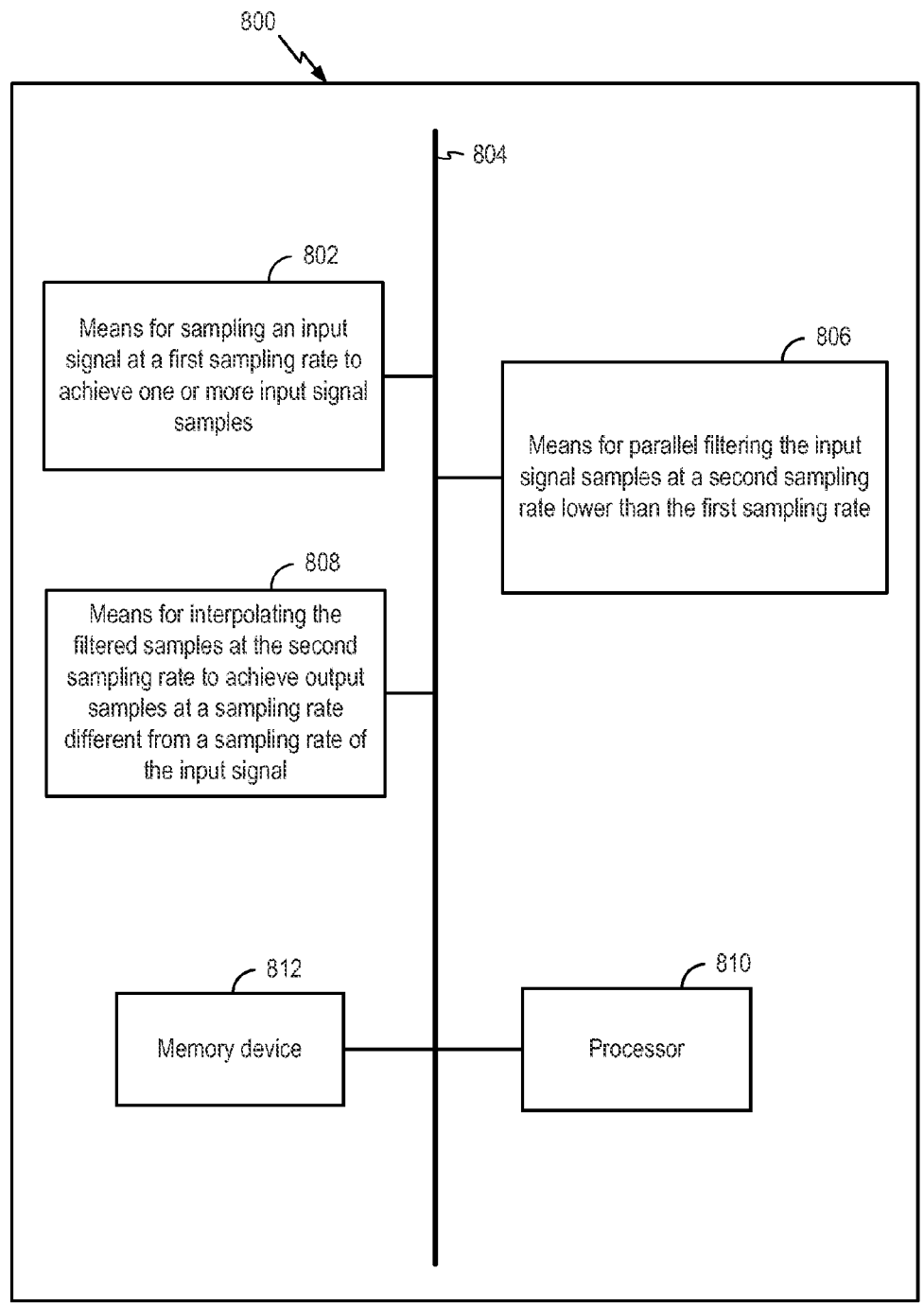
FIG. 8 a diagram of still another resampler apparatus according to the present disclosure.

FIG. 8 illustrates another resampling apparatus 800 for sampling rate conversion in a wireless transceiver, such as transceiver 200 in FIG. 2. Apparatus 800 includes a means 802 for sampling an input signal at a first predetermined sampling rate to achieve one or more input signal samples. Means 802 may be embodied by first sampling clock rate upsampling the input signal samples in the apparatus of FIG. 5 or registers 606 clocked or gated by CLK 1 determined by controller 610, the prior signal processing chain 604 in the apparatus of FIG. 6, or an equivalent apparatus for upsampling or increasing a sampling rate.

Apparatus 800 is also shown with a communication bus 804 or similar communicative coupling for illustrating communication between the various means or modules illustrated in FIG. 8. After the sampling by means 804, the upsampled input signal samples are communicated to a means 806 for parallel filtering the input signal samples at a second predetermined sampling rate lower than the first predetermined sampling rate. In an aspect, means 806 may be implemented by a plurality of parallel polyphase filters operating at the second predetermined sampling rate (e.g., CLK 2). Additionally, the second predetermined sampling rate may be set based on at least one performance requirement of a wireless transceiver in which apparatus 800 is utilized. In particular, means 706 may be implemented by the polyphase filters 602 and registers 612 in combination with CLK 2 as illustrated by FIG. 6, or equivalent apparatus effecting parallel filtering with means for setting a clock or sampling rate at which the filters are operated. As another example, the filter bank 510 in the apparatus of FIG. 5 may implement means 806 with a plurality of filters operable at the second predetermined sampling rate. Additionally, means 806 may further operate to select among outputs of a plurality of polyphase filters such as by use of a multiplexer (e.g., 618) or equivalent apparatus for selecting among a plurality of signals.

Apparatus 800 also includes means 808 for interpolating the filtered input signal samples at the second predetermined sampling rate to achieve output samples at a sampling rate (e.g., $F_{out}$) different from a sampling rate of the input signal (e.g., $F_{in}$) as illustrated by block 806, or, in other words, resampling of the input signal. Means 808 may be implemented, for example, through a linear interpolating resampler such as an interpolator 512 in the apparatus of FIG. 5 or interpolation unit 620 in the apparatus of FIG. 6. Furthermore, the means for interpolating may be operable at a low sample rate due to means 806 having parallel filtering, such that interpolation may be performed using a single multiplier, such as multiplier 626 in order to reduce the complexity and cost.

Is also noted that the means 806 and 808 are operable at the second predetermined sampling rate, such as CLK 2, which, in turn, is determinable based upon specific performance requirements desired for a transceiver in which the resampler is used as discussed previously.

Apparatus 800 may also include a processor 810, such as a microprocessor or a general processor that is used to implement or supplement one or more functions performed by the various means illustrated in FIG. 8. Furthermore, the processor 810 may include an associated memory or computer-readable medium 812 for storing code or instructions readable and executable by processor 810. It is noted that processor 810 may be a general purpose processor, a digital signal processor (DSP), an application specific integrated circuit (ASIC), a field programmable gate array (FPGA) or other programmable logic device, discrete gate or transistor logic, discrete hardware components, or any combination thereof.

Figure 9:
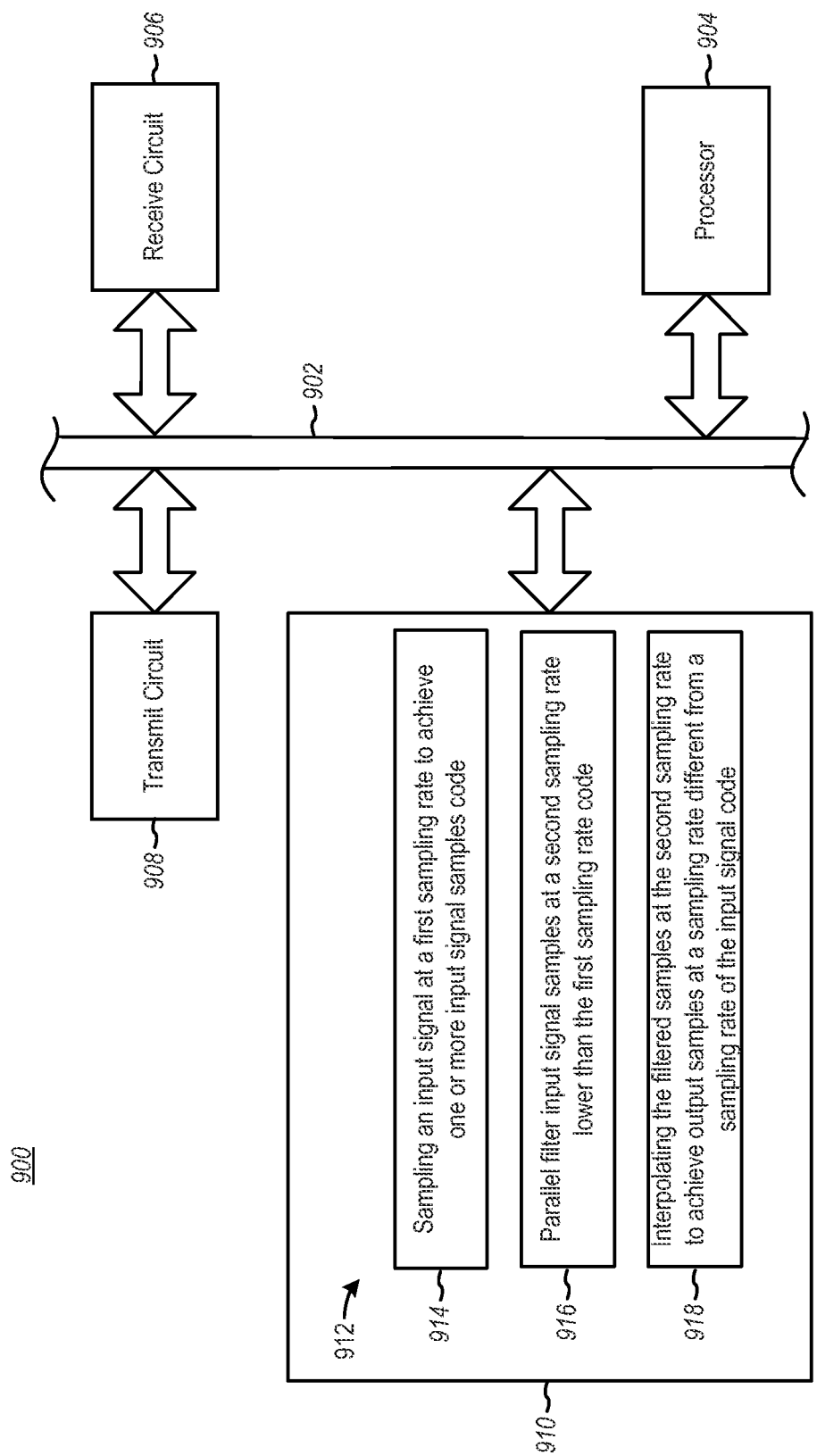
FIG. 9 shows part of a hardware implementation of an apparatus that is configured to facilitate sample rate conversion according to the present disclosure.

FIG. 9 shows part of a hardware implementation of an apparatus 900 that is configured to facilitate sampling rate conversion or resampling. The circuit apparatus is signified by the reference numeral 900, which includes circuitry and may be one configuration of a transceiver 200. In this application, it should be clear that the terms "circuit" and "circuitry" are to be construed as structural terms and not as functional terms. For example, circuitry can be an aggregate of circuit components, such as a multiplicity of integrated circuit components, in the form of processing and/or memory cells, units, blocks and the like, such as shown and described in FIG. 9.

The apparatus 900 comprises a central data bus 902 linking several circuits together. The circuits include a processor 904, a receive circuit 906, a transmit circuit 908, and a memory 910. The memory 910 is in electronic communication with the processor 904, i.e., the processor 904 can read information from and/or write information to the memory 910.

The processor 904 may be a general purpose processor, a central processing unit (CPU), a microprocessor, a digital signal processor (DSP), a controller, a microcontroller, a state machine, an application specific integrated circuit (ASIC), a programmable logic device (PLD), a field programmable gate array (FPGA), etc. The processor 904 may include a combination of processing devices, e.g., a combination of a DSP and a microprocessor, a plurality of microprocessors, one or more microprocessors in conjunction with a DSP core, or any other such configuration.

The receive circuit 906 and the transmit circuit 908 can be connected to or part of an RF (Radio Frequency) circuit, which is not shown in FIG. 9. The receive circuit 906 may process and buffer received signals before sending the signals out to the data bus 902. Additionally, the transmit circuit 908 may process and buffer the data from the data bus 902 before sending the data out of the device 900. The processor 904 may perform the function of data management of the data bus 902 and further the function of general data processing, including executing the instructional contents of the memory 910. Instead of separately disposed as shown in FIG. 9, as an alternative, the transmit circuit 908 and the receive circuit 906 may be part of the processor 904.

The memory 910 includes a set of instructions generally signified by the reference numeral 912. The instructions 912 may be executable by the processor 904 to implement the methods described herein, such as the method of FIG. 7, as one example. The instructions 912 may include code 914 for sampling an input signal at a first sampling rate to achieve one or more input signal samples. The instructions 912 may also include code 916 for initiating or controlling parallel filtering of the input signal samples at a second sampling rate lower than the first sampling rate. Finally, the instructions 912 may further include code 918 for initiating or causing interpolating the filtered samples at the second sampling rate to achieve output samples at a sampling rate different from a sampling rate of the input signal.

The instructions 912 shown in the memory 910 may comprise any type of computer-readable statement(s). For example, the instructions 912 in the memory 910 may refer to one or more programs, routines, sub-routines, modules, functions, procedures, data sets, etc. The instructions 912 may comprise a single computer-readable statement or multiple computer-readable statements.

The memory 910 may be a RAM (Random Access Memory) circuit. The memory 910 can be tied to another memory circuit (not shown) which can either be of the volatile or nonvolatile type. As an alternative, the memory 910 can be made of other circuit types, such as an EEPROM (Electrically Erasable Programmable Read Only Memory), an EPROM (Electrical Programmable Read Only Memory), a ROM (Read Only Memory), an ASIC (Application Specific Integrated Circuit), a magnetic disk, an optical disk, and others well known in the art. The memory 910 may be considered to be an example of a computer-program product that comprises a computer-readable medium with instructions 912 stored therein.

In light of the foregoing description, the present methods and apparatus afford agile sampling for multi-mode or multi-band wireless modems that support multiple technologies such as LTE, UMTS, CDMA 2000, and GPS. Additionally, the agile sampling rate conversion using polyphase filtering resampling structure enables arbitrary sampling rate conversion with effective image suppression, while affording low complexity for interpolation (e.g., only one multiplier in a first order interpolation) by reducing the sample rate needed for interpolation operation. It is also noted that the present methods and apparatus are applicable for use in a variety of communication transceiver, such as in a mobile device (e.g., a mobile handset, User Equipment (UE), Access terminal (AT), etc.) and a fixed station (e.g., a Node B, Access Point (AP), base station etc.).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

While, for purposes of simplicity of explanation, the disclosed methodologies are shown and described herein as a series or number of acts, it is to be understood that the processes described herein are not limited by the order of acts, as some acts may occur in different orders and/or concurrently with other acts from that shown and described herein. For example, those skilled in the art will appreciate that a methodology could alternatively be represented as a series of interrelated states or events, such as in a state diagram. Moreover, not all illustrated acts may be required to implement a methodology in accordance with the subject methodologies disclosed herein.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for sampling rate conversion in a transceiver, the method comprising:

sampling an input signal at a first sampling rate to obtain input signal samples at a second sampling rate lower than the first sampling rate;

filtering the input signal samples using a plurality of parallel filters to obtain filtered samples at the second sampling rate; and interpolating the filtered samples at the second sampling rate to obtain output samples at a third sampling rate different from the first sampling rate of the input signal and also different from the second sampling rate of the filtered samples.

2. The method as defined in claim 1, wherein at least one of the first and second sampling rates is adaptively set based on at least one performance requirement of the transceiver.

3. The method as defined in claim 2, wherein the at least one performance requirement includes at least one of controlling adjacent channel power leakage for a particular radio frequency band, power suppression of signal images, reducing signal degrading effects of signal images for one mode of the transceiver on signals for another mode of the transceiver, readjustment of transceiver sampling rate settings after radio frequency band change in at least one mode of the transceiver, and changing system bandwidths in a multiple system bandwidth transceiver.

4. The method as defined in claim 1, further comprising:
adaptively setting the first sampling rate based on an input control word, wherein the input control word is determined based on an external clock rate and a target value for the first sampling rate.

5. The method as defined in claim 1, further comprising:
selecting outputs of two of the plurality of parallel filters that are used for interpolating the filtered samples.

6. The method as defined in claim 5, wherein selecting the outputs of the two of the plurality of parallel filters is based on a first portion of a fractional interval calculated based on an input control word, and wherein the input control word is determined based on an external clock rate and a target value for the first sampling rate.

7. The method as defined in claim 6, wherein interpolating the filtered samples includes calculating interpolants using a second portion of the fractional interval.

8. The method as defined in claim 7, wherein the first portion comprises a first number of most significant bits of the fractional interval and the second portion comprises the difference between a total of number of bits of the fractional interval and the first number of the most significant bits of the fractional interval.

9. The method as defined in claim 1, wherein interpolating the filtered samples includes:
linearly interpolating the filtered samples at the second sampling rate to obtain the output samples at the third sampling rate.

10. The method as defined in claim 9, further comprising:
setting the second sampling rate such that linear interpolation of the filtered samples is performable using first order multiplication operations.

11. The method as defined in claim 1, wherein the second sampling rate is set by converting a rate of an external clock based on one of an integer rate conversion, a fractional rate conversion, and a rate conversion based on non-rational multiples of system natural frequencies of a wireless system in which the transceiver operates.

12. The method as defined in claim 1, wherein the second sampling rate is set to a rate that lowers the number of operations of the plurality of parallel filters when filtering the input signal samples.

13. An apparatus for sampling rate conversion in a transceiver, the apparatus comprising:

means for sampling an input signal at a first sampling rate to obtain input signal samples at a second sampling rate lower than the first sampling rate;

means for filtering the input signal samples using a plurality of parallel filters to obtain filtered samples at the second sampling rate; and means for interpolating the filtered samples at the second sampling rate to obtain output samples at a third sampling rate different from the first sampling rate of the input signal and also different from the second sampling rate of the filtered samples.

14. The apparatus as defined in claim 13, further comprising:

means for adaptively setting at least one of the first and second sampling rates based on at least one performance requirement of the transceiver.

15. The apparatus as defined in claim 14, wherein the at least one performance requirement includes at least one of controlling adjacent channel power leakage for a particular radio frequency band, power suppression of signal images, reducing signal degrading effects of signal images for one mode of the transceiver on signals for another mode of the transceiver, readjustment of transceiver sampling rate settings after radio frequency band change in at least one mode of the transceiver, and changing system bandwidths in a multiple system bandwidth transceiver.

16. The apparatus as defined in claim 13, further comprising:

means for adaptively setting the first sampling rate based on an input control word, wherein the input control word is determined based on an external clock rate and a target value for the first sampling rate.

17. The apparatus as defined in claim 13, further comprising:

means for selecting outputs of two of the plurality of parallel filters that are used for interpolating the filtered samples.

18. The apparatus as defined in claim 17, wherein the means for selecting the outputs of the two of the plurality of parallel filters is configured to select based on a first portion of a fractional interval calculated based on an input control word, and wherein the input control word is determined based on an external clock rate and a target value for the first sampling rate.

19. The apparatus as defined in claim 18, wherein the means for interpolating the filtered samples is configured to calculate interpolants using a second portion of the fractional interval.

20. The apparatus as defined in claim 19, wherein the first portion comprises a first number of most significant bits of the fractional interval and the second portion comprises the difference between a total of number of bits of the fractional interval and the first number of the most significant bits of the fractional interval.

21. The apparatus as defined in claim 13, wherein the means for interpolating the filtered samples includes means for linearly interpolating the filtered samples at the second sampling rate to obtain the output samples at the third sampling rate.

22. The apparatus as defined in claim 21, further comprising:

means for setting the second sampling rate such that the means for linearly interpolating the filtered samples is configurable with means for first order multiplication operations.

23. The apparatus as defined in claim 13, further comprising:

means for setting the second sampling rate by converting a rate of an external clock based on one of an integer rate conversion, a fractional rate conversion, and a rate conversion based on non-rational multiples of system natural frequencies of a wireless system in which the transceiver operates.

24. The apparatus as defined in claim 13, wherein the second sampling rate is set to a rate that lowers the number of operations of the plurality of parallel filters required for filtering the input signal samples.

25. An apparatus for sampling rate conversion in a transceiver, the apparatus comprising:

a sampler configured to sample an input signal at a first sampling rate to obtain input signal samples at a second sampling rate lower than the first sampling rate;

a plurality of parallel filters configured to filter the input signal samples to obtain filtered samples at the second sampling rate; and an interpolator configured to interpolate the filtered samples at the second sampling rate to obtain output samples at a third sampling rate different from the first sampling rate of the input signal and also different from the second sampling rate of the filtered samples.

26. The apparatus as defined in claim 25, wherein at least one of the first and second sampling rates is adaptively set based on at least one performance requirement of the transceiver.

27. The apparatus as defined in claim 26, wherein the at least one performance requirement includes at least one of controlling adjacent channel power leakage for a particular radio frequency band, power suppression of signal images, reducing signal degrading effects of signal images for one mode of the transceiver on signals for another mode of the transceiver, readjustment of transceiver sampling rate settings after radio frequency band change in at least one mode of the transceiver, and changing system bandwidths in a multiple system bandwidth transceiver.

28. The apparatus as defined in claim 25, further comprising:

a controller configured to adaptively set the first sampling rate based on an input control word, wherein the input control word is determined based on an external clock rate and a target value for the first sampling rate.

29. The apparatus as defined in claim 25, further comprising:

a multiplexer configured to select outputs of two of the plurality of parallel filters that are used for interpolating the filtered samples.

30. The apparatus as defined in claim 29, wherein the multiplexer is configured to select the outputs of the two of the plurality of parallel filters based on a first portion of a fractional interval calculated by a controller based on an input control word, and wherein the input control word is determined based on an external clock rate and a target value for the first sampling rate.

31. The apparatus as defined in claim 30, wherein the interpolator is configured to interpolate the filtered samples using a second portion of the fractional interval.

32. The apparatus as defined in claim 31, wherein the first portion comprises a first number of most significant bits of the fractional interval and the second portion comprises the difference between a total of number of bits of the fractional interval and the first number of the most significant bits of the fractional interval.

33. The apparatus as defined in claim 25, wherein the interpolator is configured as a linear interpolator.

34. The apparatus as defined in claim 25, further comprising:
a rate converter configured to set the second sampling rate such that the interpolator is enabled to perform interpolation of the filtered samples using a first order multiplier.

35. The apparatus as defined in claim 34, wherein the rate converter is configured to set by the second sampling rate by converting a rate of an external clock based on one of an integer rate conversion, a fractional rate conversion, and a rate conversion based on non-rational multiples of system natural frequencies of a wireless system in which the transceiver operates.

36. The apparatus as defined in claim 25, further comprising:
a rate converter configured to set the second sampling rate to a value that lowers the number of operations of the plurality of parallel filters.

37. A computer program product, comprising:
non-transitory computer-readable medium comprising:
code for causing a computer to sample an input signal at a first sampling rate to obtain input signal samples at a second sampling rate lower than the first sampling rate in a transceiver;
code for causing the computer to filter the input signal samples using a plurality of parallel filters to obtain filtered samples at the second sampling rate; and
code for causing the computer to interpolate the filtered samples at the second sampling rate to obtain output samples at a third sampling rate different from the first sampling rate of the input signal and also different from the second sampling rate of the filtered samples.

38. The computer program product as defined in claim 37, the non-transitory computer-readable medium further comprising:
code for causing the computer to adaptively set at least one of the first and second sampling rates based on at least one performance requirement of the transceiver.

39. The computer program product as defined in claim 38, wherein the at least one performance requirement includes at least one of controlling adjacent channel power leakage for a particular radio frequency band, power suppression of signal images, reducing signal degrading effects of signal images for one mode of the transceiver on signals for another mode of the transceiver, readjustment of transceiver sampling rate settings after radio frequency band change in at least one mode of the transceiver, and changing system bandwidths in a multiple system bandwidth transceiver.

40. The computer program product as defined in claim 37, the non-transitory computer-readable medium further comprising:
code for causing the computer to adaptively set the first sampling rate based on an input control word, wherein the input control word is determined based on an external clock rate and a target value for the first sampling rate.

41. The computer program product as defined in claim 37, the non-transitory computer-readable medium further comprising:
code for causing the computer to select outputs of two of the plurality of parallel filters that are used for the interpolated filtered samples.

42. The computer program product as defined in claim 41, wherein selecting the outputs of the two of the plurality of parallel filters is based on a first portion of a fractional interval calculated based on an input control word, and wherein the input control word is determined based on an external clock rate and a target value for the first sampling rate.

43. The computer program product as defined in claim 42, wherein interpolating the filtered samples includes calculating interpolants using a second portion of the fractional interval.

44. The computer program product as defined in claim 43, wherein the first portion comprises a first number of most significant bits of the fractional interval and the second portion comprises the difference between a total of number of bits of the fractional interval and the first number of the most significant bits of the fractional interval.

45. The computer program product as defined in claim 37, wherein interpolating the filtered samples includes:
linearly interpolating the filtered samples at the second sampling rate to obtain the output samples at the third sampling rate.

46. The computer program product as defined in claim 45, further comprising setting the second sampling rate such that linear interpolation of the filtered samples is performable using first order multiplication operations.

47. The computer program product as defined in claim 37, wherein the second sampling rate is set by converting a rate of an external clock based on one of an integer rate conversion, a fractional rate conversion, and a rate conversion based on non-rational multiples of system natural frequencies of a wireless system in which the transceiver operates.

48. The computer program product as defined in claim 37, the non-transitory computer-readable medium including code for causing the computer to set the second sampling rate at a rate that lowers the number of operations of the plurality of parallel filters when filtering the input signal samples.

* * * * *